(12) United States Patent
Ahmed et al.

(10) Patent No.: US 9,966,915 B2
(45) Date of Patent: May 8, 2018

(54) PROGRAMMABLE AMPLIFIER AND METHOD OF OPERATING THE SAME

(71) Applicant: SEMICONDUCTOR COMPONENTS INDUSTRIES, LLC, Phoenix, AZ (US)

(72) Inventors: Abdullah Ahmed, Scarborough (CA); Frederick Edward Sykes, Burlington (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/222,355

(22) Filed: Jul. 28, 2016

(65) Prior Publication Data

US 2018/0034430 A1  Feb. 1, 2018

(51) Int. Cl.
| | | |
|---|---|---|
| *H03F 1/34* | (2006.01) | |
| *H03G 3/30* | (2006.01) | |
| *H03F 3/45* | (2006.01) | |

(52) U.S. Cl.
CPC .......... *H03G 3/30* (2013.01); *H03F 3/45475* (2013.01); *H03F 2200/171* (2013.01); *H03F 2203/45044* (2013.01)

(58) Field of Classification Search
CPC ........ H03F 1/02; H03F 1/34; H03F 2200/156; H03F 2200/159; H03F 3/005
USPC ........................................ 330/9, 86, 107, 109
See application file for complete search history.

(56) References Cited

U.S. PATENT DOCUMENTS

| | | | | |
|---|---|---|---|---|
| 4,841,263 A | * | 6/1989 | Mulawka | ............. H03H 19/004 327/552 |
| 8,638,165 B2 | | 1/2014 | Shah et al. | |

OTHER PUBLICATIONS

Xiaodan Zou, "A 1-V 450-nW Fully Integrated Programmable Biomedical Sensor Interface Chip," IEEE Journal of Solid-State Circuits, vol. 44, No. 4, Apr. 2009, pp. 1067-1077.

* cited by examiner

*Primary Examiner* — Steven J Mottola
(74) *Attorney, Agent, or Firm* — Robert F. Hightower

(57) ABSTRACT

A programmable amplifier includes an amplifier, an input capacitor, a feedback circuit, and a high-pass filter circuit. The amplifier has an input coupled to the input capacitor for receiving an input signal. The feedback circuit includes multiple feedback capacitors of differing capacitance values that are each selectively coupled between the output of the amplifier and the input of the amplifier using multiple first switches. The high-pass filter circuit includes multiple switched capacitors of differing capacitance values that are each selectively coupled between the amplifier output and a ground node using multiple second switches. The first switches are configured to be selectively switched on for activating at least one feedback capacitor to adjust a gain of the amplifier, while the second switches are configured to be selectively switched at a first and second phase of a clock signal to adjust a high-pass cutoff frequency of the amplifier independently of how the gain is adjusted.

21 Claims, 5 Drawing Sheets

PROGRAMMABLE AMPLIFIER AND METHOD OF OPERATING THE SAME

TECHNICAL FIELD

Aspects of the present disclosure relate to amplifiers and, in particular, to a programmable amplifier and method of operating the same.

BACKGROUND

Amplifiers are often used in various electronic applications. An amplifier is an electrical device that alters the amplitude and/or phase characteristics of a signal. Additionally, an amplifier may have filtering characteristics to pass signals in certain frequency ranges and attenuate signals in other frequency ranges. The behavior of an amplifier may be described mathematically in the frequency-domain in terms of its transfer function. The transfer function describes, among other things, the ratio between the input signal amplitude and the output signal amplitude applied of the amplifier. The amplitude response curve describes the effect of the amplifier on the amplitude of the input signal at various frequencies.

SUMMARY

According to one aspect, a programmable amplifier includes an amplifier, an input capacitor, a feedback circuit, and a high-pass filter circuit. The amplifier has an input coupled to the input capacitor for receiving an input signal. The feedback circuit includes multiple feedback capacitors of differing capacitance values that are each selectively coupled between the output of the amplifier and the input of the amplifier using multiple first switches. The high-pass filter circuit includes multiple switched capacitors of differing capacitance values that are each selectively coupled between the amplifier output and a ground node using multiple second switches. The first switches are configured to be selectively switched on for activating at least one feedback capacitor to adjust a gain of the amplifier, while the second switches are configured to be selectively switched at a first and second phase of a clock signal to adjust a high-pass cutoff frequency of the amplifier independently of how the gain is adjusted.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Figure 1:
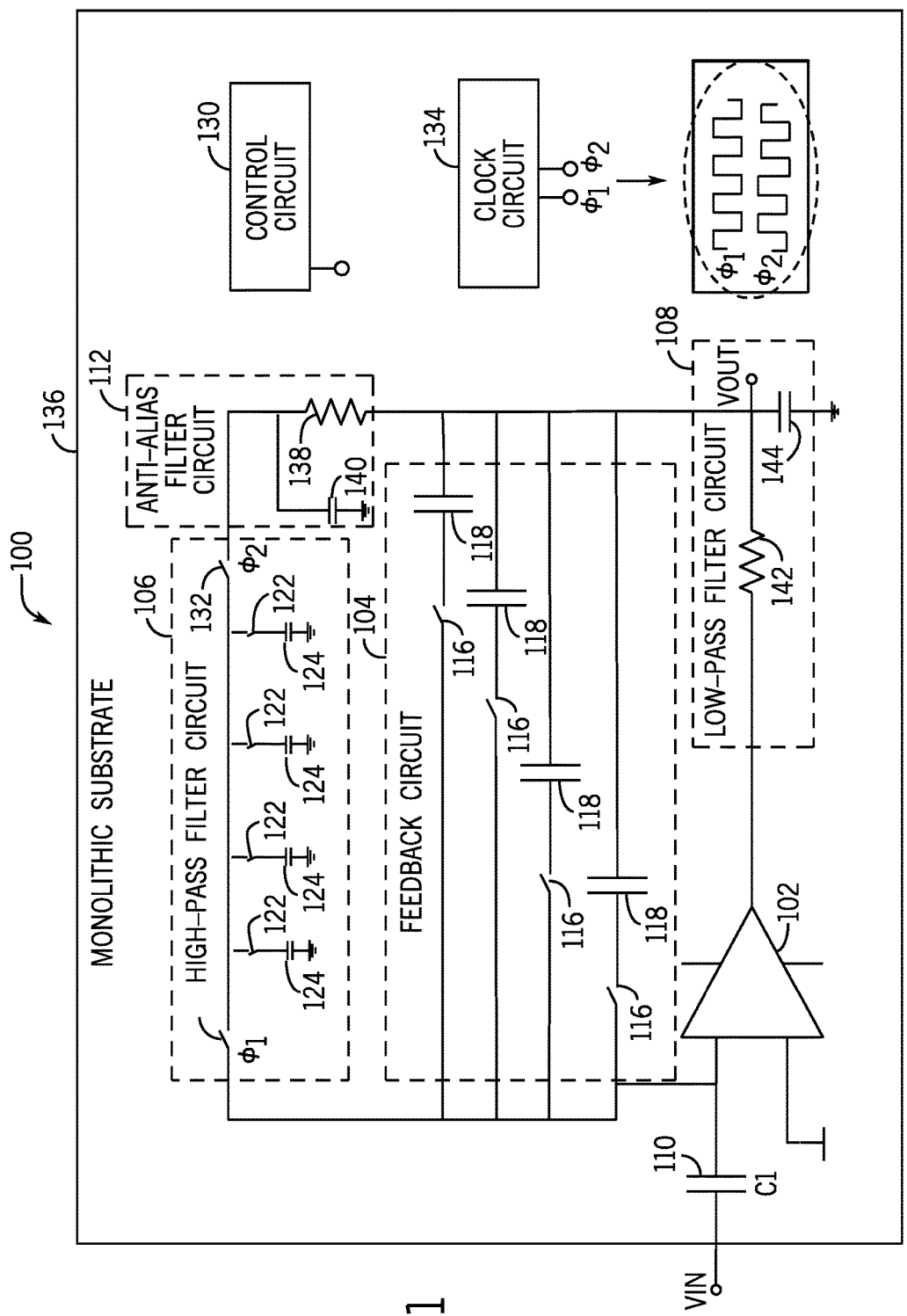
FIG. 1 illustrates an example programmable amplifier according to one embodiment of the present disclosure

Embodiments of the present disclosure provide a programmable amplifier that can be implemented on a monolithic substrate for amplifying a signal with a gain that is adjustable while providing a high-pass cutoff frequency that can be adjusted independently of the gain. Although conventional amplifier designs have been developed to provide programmable gain, their implementation has involved several salient drawbacks, such as limited output voltage swing, limited output gain due to size constraints of the electrical components (e.g., resistors, capacitors, etc.) used in these conventional designs, and the ability to control the output gain independently of any low and/or high frequency cutoff points. Embodiments of the present disclosure provide a solution to this problem by using a feedback circuit with a group of multiple capacitors that can be selectively activated for adjusting a gain of an amplifier, and a high-pass filter circuit having another group of multiple capacitors that can be selectively activated for adjusting a high-pass cutoff frequency of the amplifier in which the gain and the high-pass cutoff frequency may be adjusted independently of one another. Additionally, the programmable amplifier may include a low-pass filter, and an anti-alias filter for attenuating noise at or close to the switching frequency of the high-pass filter.

Conventional attempts at providing a programmable amplifier have involved the use of a negative feedback circuit with one or more variable impedance devices (e.g., variable resistors, variable capacitors, etc.) in which the gain of the amplifier is a function of the variable impedance in the feedback loop divided by an input impedance. However, varying the feedback impedance also causes a shift in the high-frequency cutoff point of the amplifier. Additionally, impedance values required for effective gain control is, in many cases, prohibitively high for most applications. Other attempts at programmable control of amplifiers have involved the use of transistors configured as tuned-resistor circuits that are implemented in the feedback path of the amplifier for varying its gain. However, these tuned-resistor circuits are only linear over a small range, a condition that often limits the output voltage swing of the amplifier. Yet other attempts have involved the use of switched capacitor circuits configured in the negative feedback path of an amplifier. Although this topology provides improved linearity over tuned-resistor circuits, they do not provide for effective control over the frequency characteristics of the amplifier as its gain is varied. That is, these switched capacitor circuits do not allow for independent control over the gain of an amplifier relative to its low frequency or high frequency cutoff points.

Significant demand exists in the integration of components for body worn electronics. For example, monitors for biological signals and circuits for hearing aids often require front end amplifiers with a specified high pass filter cutoff in the amplification channel. Conventionally, this has been achieved using an external capacitor as the input and an on-chip capacitor in the feedback path of the amplifier. For certain body-worn applications, multiple signal inputs may be used in which each signal input has required its own separate external input capacitor. As such, the size and cost of these designs may be substantial when body-worn applications are implemented with multiple signal inputs. Additionally, the accuracy of the high pass frequency corner is limited to the tolerance of the external capacitor, even when on-chip trimming is used to set the input impedance to a desired target value. Additionally, some conventional designs have used on-board high resistance value resistors (e.g., greater than 1 Giga-Ohm) in the feedback path of the amplifier. However, for low values of high pass filter frequencies of 10 Hertz and even down to 0.5 Hertz, on-chip implementation of resistors is often prohibitive due to the area required on the monolithic substrate. Other conventional techniques involve transistor-based resistor equivalent circuits that simulate a resistor. But these transistor-based resistor equivalent circuits suffer from limited linearity, thus limiting the output signal level. Where high dynamic range is required and output signal levels of the amplifier can be substantial, this technique may have limited value.

FIG. 1 illustrates an example programmable amplifier 100 according to one embodiment of the present disclosure that may provide a solution to the conventional programmable amplifiers described above as well as other drawbacks associated with conventional programmable amplifiers. The programmable amplifier 100 generally includes an amplifier 102, a feedback circuit 104, a high-pass filter circuit 106, a low-pass filter circuit 108, an input capacitor 110, and an anti-alias filter circuit 112 coupled together as shown. The feedback circuit 104 includes feedback switches 116 for each of multiple feedback capacitors 118 having differing capacitance values to selectively couple the amplifier output to the amplifier input for adjusting a gain of the amplifier 100. The high-pass filter circuit 106 includes multiple switched capacitor switches 122 for each of multiple switched capacitors 124 having differing values to selectively activated by the switched capacitor switches 122 between a feedback path of the amplifier to ground for adjusting a high-pass cutoff frequency of the amplifier 102. Thus, the gain and the high-pass cutoff frequency may be adjusted independently of one another via selection of the capacitance values for the feedback capacitors 118 and the switched capacitors 124, respectively.

Although four feedback capacitors 118 and four switched capacitors 124 are shown, it should be appreciated that any quantity of feedback capacitors 118 and/or switched capacitors 124 may be used for independent control over the gain and high-pass cutoff frequency of the amplifier 100. For example, the programmable amplifier 100 may include two, three, or five or more feedback capacitors 118, and/or two, three, or five or more switched capacitors 124 based upon the granularity and/or range of gain and high-pass cutoff frequency control desired.

For many applications, such as those used in body worn electronics (e.g., cardiac monitors hearing aids, etc.), it would be beneficial to provide variable gain due to varying input signal levels that is often caused by inconsistent sensor implementation. The gain of many conventional programmable amplifiers can be varied by changing the ratio of the effective capacitance of the feedback circuit to input capacitance. When the gain of these conventional programmable amplifiers are varied in such a manner, the high pass frequency cutoff also changes as a product of the frequency times the feedback capacitance divided by the input capacitance (fx*Cx/C2). Embodiments of the present disclosure provide a high-pass filter circuit 106 that may be implemented as a variable switched capacitor circuit in the feedback path of the programmable amplifier 100 to provide a fixed high pass frequency cutoff of choice that may be maintained for variable gains. Additionally, compared to conventional designs this implementation provides a fixed high pass frequency cutoff while reducing or eliminating distortion caused by large signal swings that may typically be experienced during normal use.

A control circuit 130 may be included to activate the feedback switches 116 for setting the gain of the programmable amplifier 100, and activate the switched capacitor switches 122 for setting a desired high-pass cutoff frequency of the programmable amplifier 100. The high-pass filter circuit 106 includes two phase switches 132 that are driven by a clock circuit 134 such that the high-pass filter circuit 106 functions as a switched capacitor filter. The clock circuit 134 generates two clock signals ($\varphi_1$ and $\varphi_2$) that are logical complements of one another and are non-overlapping. The clock circuit 134 may generate the clock signals at any suitable frequency. In one embodiment, the clock circuit 134 is configured to generate the clock signals with a frequency that is at least twice the high-pass cutoff frequency. In one particular embodiment in which the programmable amplifier 100 is to amplify signals in the range of 0.5 to 10 Hertz, the clock circuit 134 may generate the clock signals with a specified frequency of 510 Hertz. Nevertheless, it should be appreciated that clock signals may be generated at any suitable frequency of operation for implementing the switched capacitor filter of the high-pass filter circuit 106, such as frequencies lower than 510 Hertz, or frequencies greater than 510 Hertz.

In some cases, when the programmable amplifier 100 may be implemented with body worn electronics (e.g., cardiac monitors, hearing aids, cochlear implants, etc.), it may be beneficial to provide adjustable gain while maintaining consistent frequency characteristics. Thus, the high-pass filter circuit 106 may be used as a high-pass frequency compensation circuit to ensure that the high-pass cutoff frequency remains relatively consistent as the gain is adjusted.

By use of the switched capacitor approach, unwanted alias-based noise may be introduced due to the possibility of ultrasonic signals or other signals being picked up at the input and/or output with frequencies approaching that of the clock signals; thus, the on-chip anti-alias filter circuit 112 may be provided to attenuate such alias products. The anti-alias circuit 112 includes a resistor 138 and a capacitor 140 that functions as a low-pass filter with a corner frequency slightly below the switching frequency of the clock circuit 134. In some or most cases, the anti-alias filter circuit 112 may filter extraneous noise signals relatively close to the frequency of the clock signals by more than 22 dB regardless of the gain setting of the programmable amplifier 100. That is, because the high-pass filter circuit 106 uses a switched capacitor filtering scheme, the anti-alias filter circuit 112 may be used to filter extraneous signals with frequencies that may be relatively close to the switching frequency of the clock circuit 134 that would otherwise amplify the unwanted noise in the programmable amplifier 100. For example, extraneous noise may be introduced at the input of the programmable amplifier 100 via electromagnetic interference (EMI) and/or via backwards driven noise introduced at the output of the programmable amplifier 100, such as when the output of the programmable amplifier 100 is coupled to an analog to digital converter (ADC) that may introduce switching noises back through its input. Additionally, the low-pass filter circuit 108 may include a resistor 142 and a capacitor 144 for setting an upper 3 decibel corner frequency for limiting or reducing high frequency components of the input signal.

The feedback switches 116 and switched capacitor switches 122 may be any suitable type. In one embodiment, the feedback switches 116 and switched capacitor switches 122 comprise field-effect-transistors (FETs) configured as analog switches that can cyclically switch between a high impedance (e.g., approaching infinite resistance) to a short circuit (e.g., approximately 0 Ohms). The feedback switches 116 and switched capacitor switches 122 may be controlled by the control circuit 130 that selects certain switches 116 and 122 according to a desired gain and high-pass cutoff frequency desired for the programmable amplifier 100. For example, the programmable amplifier 100 may be integrally fabricated with a control circuit 130 on a single monolithic substrate 136 in which the control circuit 130 is used to control the operation of the programmable amplifier 100 as well as other functions, such as additional processing of the signals outputted from the programmable amplifier 100 via devices, such as analog to digital converters, digital signal processors, multiplexers, demultiplexers, and the like. In one embodiment, the control circuit 130 may include at least one processor that executes instructions stored in at least one memory (e.g., computer readable media) for performing the various features of the control circuit 130 described herein. In other embodiments, the control circuit 130 may be embodied in other specific forms, such as discrete and/or integrated analog circuitry, field programmable gate arrays (FPGAs), application specific integrated circuitry (ASICs), or any combination thereof.

According to one embodiment, the amplifier 102, feedback circuit 104, high-pass filter circuit 106, input capacitor 110, low-pass filter circuit 108, anti-alias filter circuit 112, and control circuit 130 are integrally formed on a monolithic substrate 136. Such an arrangement may be useful for applications where multiple programmable amplifiers 100 are used. For example, multiple programmable amplifiers 100 may be implemented on a single monolithic substrate 136 for use in amplifying multiple cardiac signals received from multiple sensors configured on a heart patient.

Because the diagnosis of certain cardiac issues often involves precise measurement of the relative strengths of multiple cardiac signals, amplification of the multiple cardiac signals in a relatively consistent manner across multiple signals may provide important information for effective analysis and treatment of cardiac ailments. As such, the feedback capacitors 118 and switched capacitors 124 of multiple programmable amplifiers 100 may be arranged on the substrate 136 in a manner so that the relative performance of each programmable amplifier 100 remains relatively constant across most or all of the multiple programmable amplifiers 100. For example, the feedback capacitors 118 of multiple programmable amplifiers 100 may be arranged in relative close proximity to one another on one region of the monolithic substrate 136, while the switched capacitors 124 may be arranged in relatively close proximity to one another region of the monolithic substrate 136 so that the relative gains and/or high-pass cutoff frequencies of multiple programmable amplifiers 100 remain relatively consistent. Nevertheless, it is contemplated that the clock circuit 100 may be embodied in other specific forms without deviating from the spirit and scope of the present disclosure. For example, it is contemplated that the programmable amplifier 100 may be implemented for use with other applications, such as audio amplifiers or other circuits where programmable gain and frequency characteristics may be independently adjusted. Additionally, the programmable amplifier 100 may be made mostly or entirely with discrete components.

Certain embodiments of the present disclosure may provide advantages not heretofore recognized by conventional programmable amplifier topologies. For example, applications for body worn electronics, such as cardiac monitors, may be realized with relatively fewer discrete components as a larger portion of the circuitry required for monitoring one or more cardiac signals can now be integrally formed on a single monolithic substrate. This advantage becomes even more evident given that cardiac monitors typically process signal characteristics within a bandwidth (BW) of approximately 0.5 to 10 Hertz, a range that has almost always required the use of certain external components with conventional programmable amplifier designs. Additionally, because the feedback circuit 104 and high-pass filter circuit 106 can now be formed internally (onboard) on the monolithic substrate 136, their characteristics can be closely matched so that multiple programmable amplifiers 100 can be implemented with repeatable, consistent performance characteristics relative to one another. Also, because the high-pass filter circuit 106 is implemented using switched capacitor techniques, the programmable amplifier 100 may occupy a relatively smaller portion of the monolithic substrate 136 than would otherwise be required when using conventional resistor designs (e.g., polysilicon resistors). In multi-channel systems, such as those used in cardiac monitors, each channel should be closely matched. Embodiments of the present disclosure may provide relatively good matching by physical layout of the feedback capacitors 118 and switched capacitors 124 on the monolithic substrate 136 as well as selecting a frequency of the clock circuit 134 so that gain and the high-pass frequency cutoff may be matched for each channel.

The control circuit 130 controls the gain of the programmable amplifier 100 by alternatively activating one or more of the feedback switches 116. For example, the control circuit 130 may continually monitor the output of the programmable amplifier 100 and reduce the gain of the programmable amplifier 100 when the amplitude of the output of the programmable amplifier 100 exceeds a specified maximum threshold, and increase the gain when the amplitude goes below a specified minimum threshold. The gain of the programmable amplifier 100 is given by:

$$\text{Gain} = \frac{Cin}{Cfdbk/n}$$

Where Cfdbk is the cumulative value of feedback capacitors activated in the feedback circuit 104, while Cin is the value of the input capacitor 110. The high pass frequency cutoff of the programmable amplifier 100 is given by:

$$\text{High Pass Frequency Cutoff} = \frac{fsw \cdot \frac{Csw}{n}}{2 \cdot \pi \cdot \frac{Cfdbk}{n}}$$

Where fsw is the switching frequency of the clock circuit, and Csw is the cumulative value of switched capacitors 124 that have been activated in the high-pass filter circuit 106. As can be seen, adjusting the effective value of Cfdbk will also affect the high-pass cutoff frequency. Nevertheless, when a fixed high-pass cutoff frequency is desired, activation of the switched capacitors 124 may be adjusted to compensate for changes in the feedback capacitance so that a constant high-pass cutoff frequency is maintained.

Table 1 shows several example values that may be used for the feedback capacitors 118 and switched capacitors 124 to provide a gain that is variable between approximately 0, 6, 12, and 18 decibels (dB) while maintaining a high-pass cutoff frequency of approximately 0.43 Hertz. Nevertheless, it should be appreciated that the values shown in Table 1 are only example values and that other values for the feedback capacitors 118 and switched capacitors 124 may be used. Additionally, it should be appreciated that other programmable amplifiers 100 may exhibit differing measured values of effective feedback resistance (Rfdbk) and high-pass cutoff frequency than what is shown herein.

TABLE 1

| n | C1 (pF) | Cfdbk/n (pF) | Gain (dB) | Csw/n (pF) | Effective Rfdbk | High-pass frequency Corner (Hz) |
|---|---|---|---|---|---|---|
| 1 | 300 | 300 | 0 | 1.6 | 1.22GΩ | 0.43 |
| 2 | 300 | 150 | 6.02 | 0.8 | 2.44GΩ | 0.43 |
| 4 | 300 | 75 | 12.04 | 0.4 | 4.88GΩ | 0.43 |
| 8 | 300 | 37.5 | 18.06 | 0.2 | 9.76GΩ | 0.43 |

Note the actual feedback capacitance (Cfdbk) will be binary weighted and thus partitioning of the capacitors on the monolithic substrate may be made to save layout area on the chip. Additionally, the effective feedback resistance (Rfdbk) may be relatively high when a gain of 18 dB is selected. Therefore, to reduce DC offset drift in such cases, the amplifier 102 may be implemented with thick gate transistors that have relatively low gate leakage current to reduce the direct current (DC) offset. For cases where increased values of gain are desired, the value of the input capacitor (Cin) may be increased, such as by making the input capacitor external to the monolithic substrate 136. When the input capacitor 110 is made external to obtain higher gains, the programmable amplifier 100 may still provide a constant high-pass cutoff frequency due to its independence from the input capacitor 110 value as well as due to the ability to adjust the variable switch capacitor value.

Although FIG. 1 illustrates an example programmable amplifier 100 in which its gain and high-pass frequency may be independently controlled, it should be understood that other embodiments of the programmable amplifier 100 may include additional, fewer, or different components than what is shown herein without departing from the spirit and scope of the present disclosure. For example, the anti-alias filter circuit 112 may be omitted if attenuation of noise that is close to the frequency of the clock circuit 134 is not needed or desired. As another example, other signal conditioning components, such as white noise filters, pink noise filters, or other types of filtering mechanisms may be added to further condition signals amplified by the programmable amplifier 100.

Figure 2:
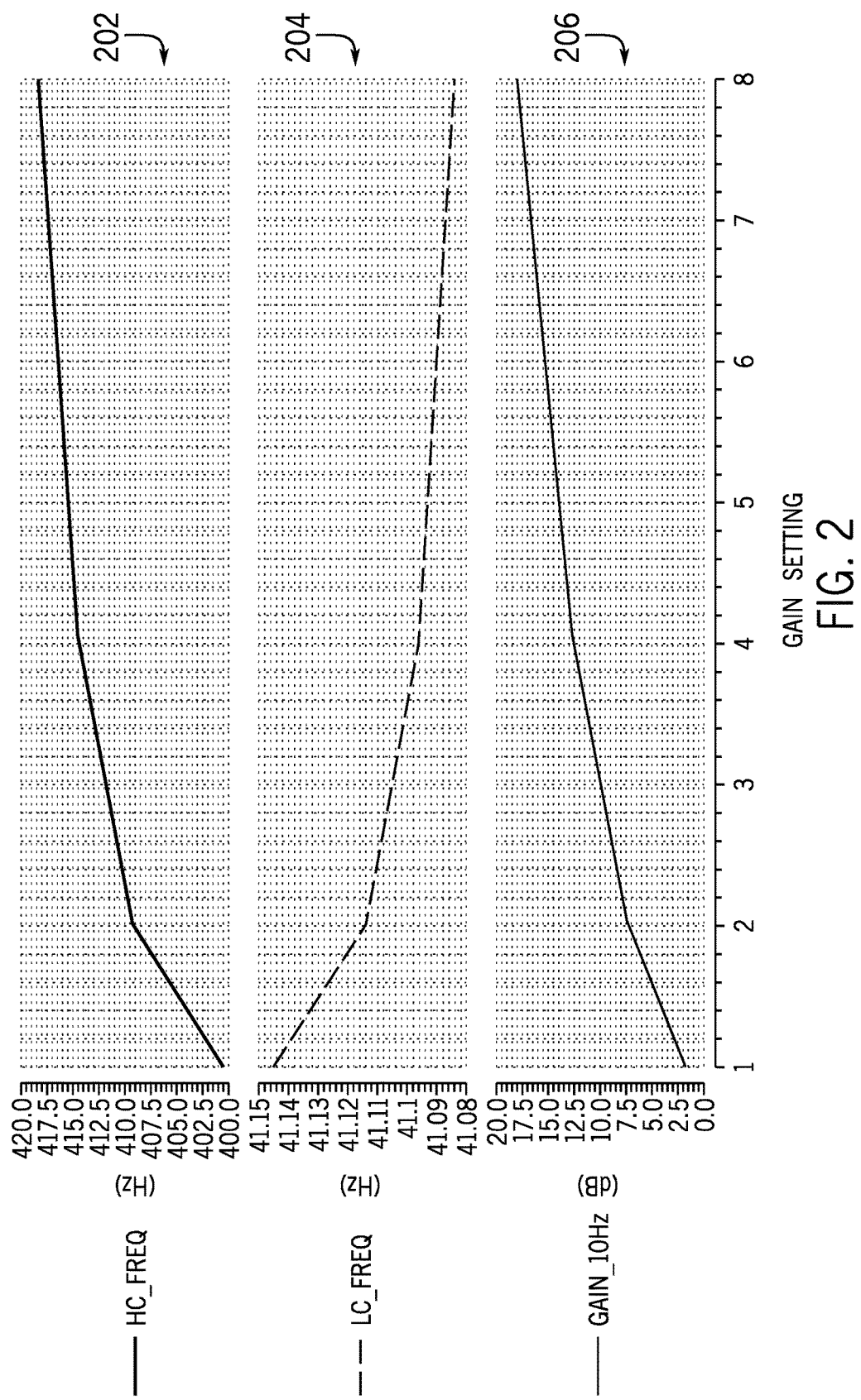
FIG. 2 illustrates example plots for the low-pass frequency cutoff, the high-pass frequency cutoff, and gain that may be exhibited by the programmable amplifier of FIG. 1 according to one embodiment of the present disclosure.

FIG. 2 illustrates example plots 202, 204, and 206 for the low-pass frequency cutoff, the high-pass frequency cutoff, and gain that may be exhibited by the programmable amplifier 100 of FIG. 1 according to one embodiment of the present disclosure. In particular, plot 202 shows a high pass frequency (HC FREQ) that may be exhibited as a test signal is injected into the input of the programmable amplifier 100 from 425.6.0 to 428.0 milliHertz, plot 204 shows a low pass frequency (LC FREQ) that may be exhibited as another test signal is injected into the input of the programmable amplifier 100 from 43 Hertz, while plot 206 shows the gain (gs) at 10 Hertz that may be exhibited as a test signal is injected into the input of the programmable amplifier 100 from −0.1 to 18.0 decibels (dB). Nevertheless, it should be appreciated that the plots shown are provided as only one example of the performance of the programmable amplifier 100 and that other plots may include differing performance characteristics than what is shown herein.

Figure 3:
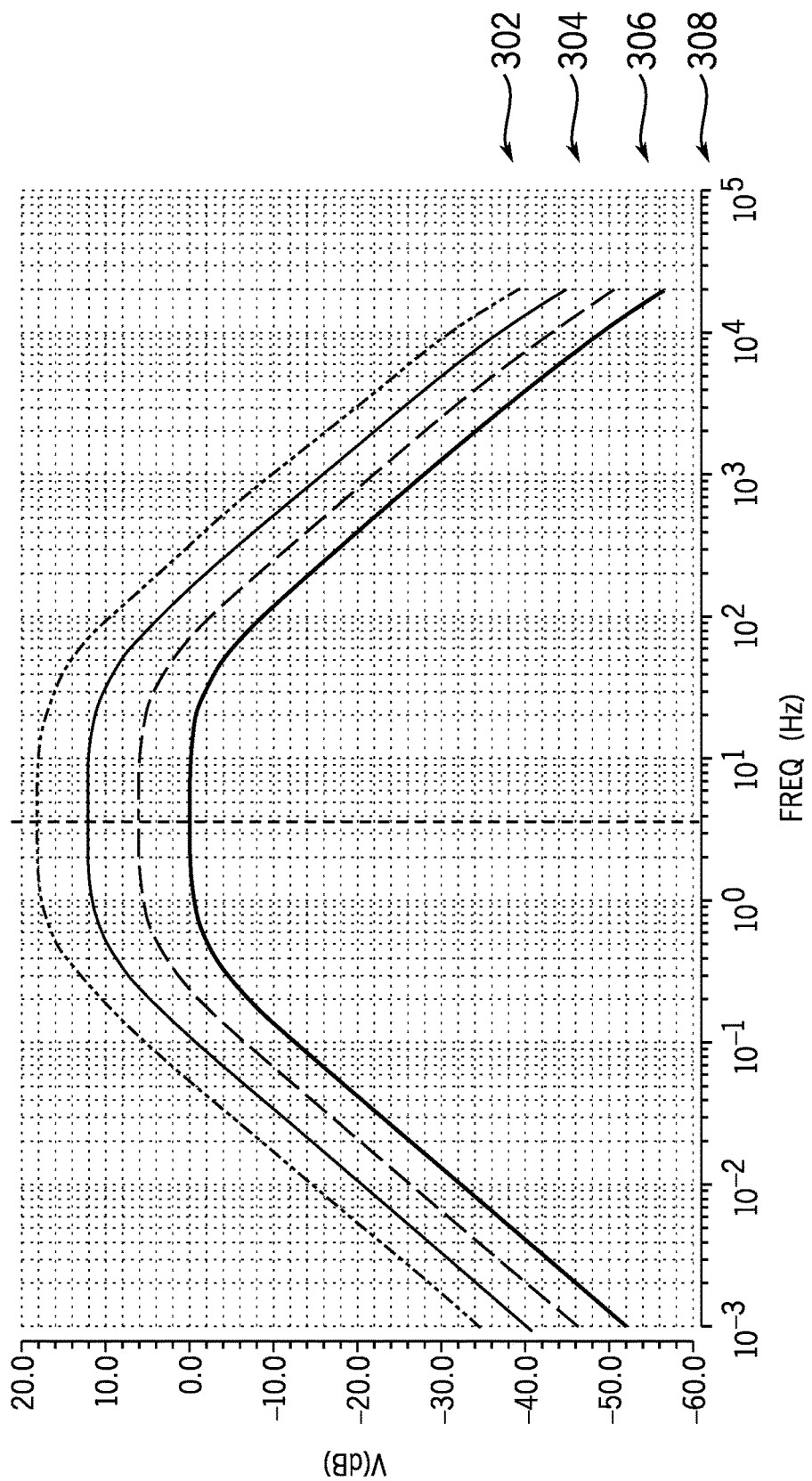
FIG. 3 illustrates plots of a frequency response of the programmable amplifier of FIG. 1 that may be exhibited for four differing gain settings according to one embodiment of the present disclosure.

FIG. 3 illustrates plots 302, 304, 306, and 308 of a frequency response of the programmable amplifier 100 of FIG. 1 that may be exhibited for four differing gain settings according to one embodiment of the present disclosure. In particular, plot 302 shows a frequency response that may be exhibited by the programmable amplifier 100 that has been programmed to have a gain of 0.0, plot 304 shows a frequency response that may be exhibited by the programmable amplifier 100 that has been programmed to have a gain of 6.0, plot 302 shows a frequency response that may be exhibited by the programmable amplifier 100 that has been programmed to have a gain of 12.0, while plot 302 shows a frequency response that may be exhibited by the programmable amplifier 100 that has been programmed to have a gain of 18.0. As shown, the low-pass frequency cutoff is shown to be approximately 0.4 Hertz, which is achieved by the low-pass filter circuit 108. The low pass filter circuit 108 provides attenuation prior to the output signal feeding into another component, such as an ADC, which may be sampled at a different sampling clock speed. The low-pass filter circuit 108 may also provide attenuation of any potential alias signals caused by the sampling clock of the ADC.

Figure 4:
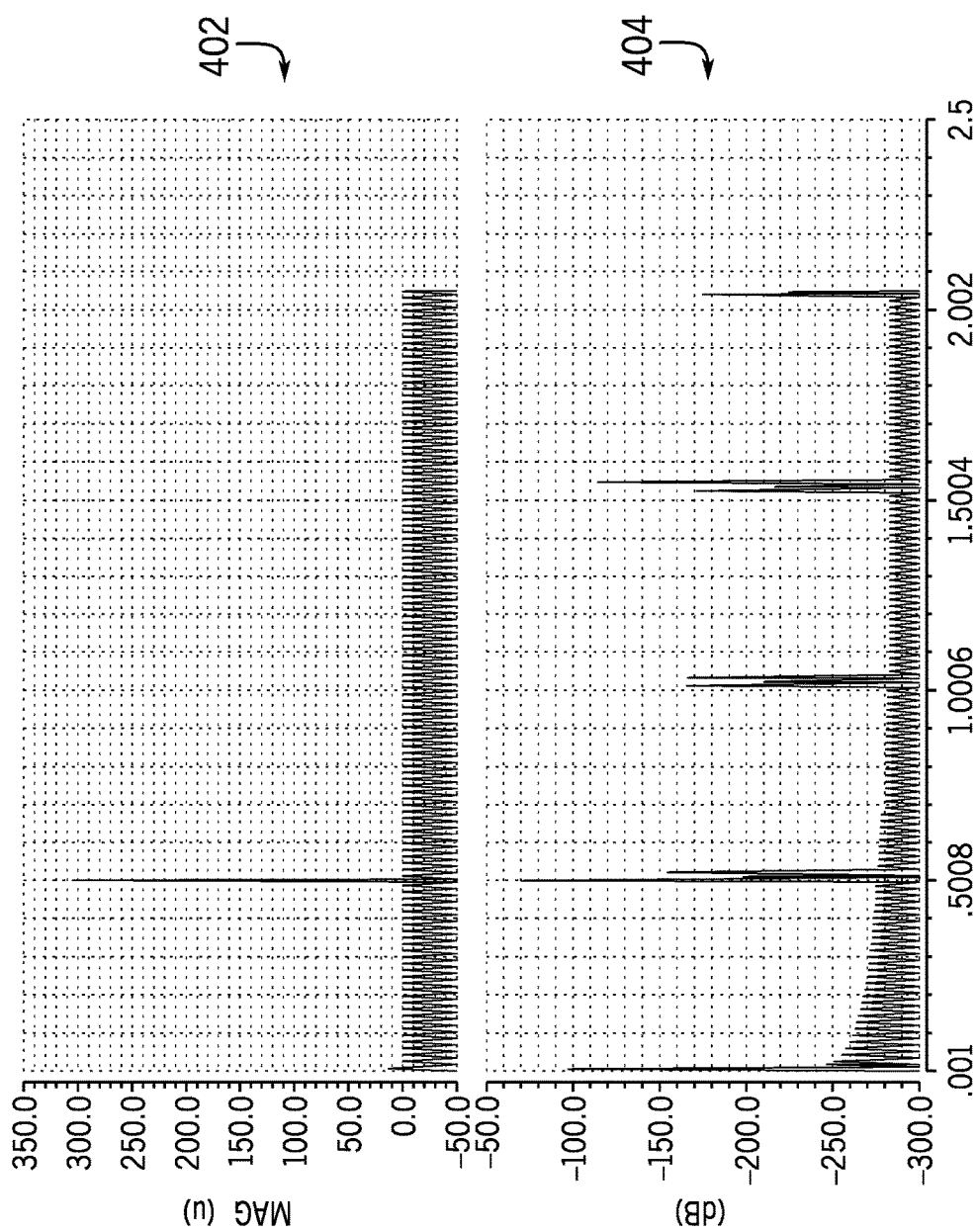
FIG. 4 illustrates example plots that may be exhibited by the programmable amplifier of FIG. 1 due to the presence of noise with a frequency approximating that of the frequency of the clock circuit according to one embodiment of the present disclosure.

FIG. 4 illustrates example plots 402 and 404 that may be exhibited by the programmable amplifier 100 of FIG. 1 due to the presence of noise having a frequency approximating that of the frequency of the clock circuit 134 according to one embodiment of the present disclosure. In particular, plot 402 shows a noise signal that may be injected into the input of the programmable amplifier 100 (e.g., a 1.0 millivolt peak-to-peak signal at 502 Hertz that is injected into the input while the frequency of the clock circuit 134 is set to 512 Hertz), while plot 404 shows a gain that may be exhibited by the aliasing signal by the programmable amplifier 100.

As shown, the gain of the aliasing signal through the programmable amplifier 100 has a spike in energy at 10 Hertz, the Input signal frequency of the 502 Hertz aliasing signal against the 512 Hertz clock circuit frequency, but the energy level is approximately −90 decibels, well within the noise floor of the programmable amplifier 100. The suppression of the aliased signal at 10 Hz down to −90 decibels is achieved by the presence of anti-alias filter. Additionally, the gain of the Input signal shows a spike at approximately 502 Hertz, but again the energy at this frequency is approximately −64 decibels (dB), which is practically out of band and does not matter.

The anti-alias filter circuit 112 may be implemented with a resistance and capacitance values compared to the feedback resistance to provide attenuation of any alias producing noise. In body work electronics, when user is exposed to ultrasonic or other signals with frequencies approaching the frequency of the clock circuit (fsw) 134, assuming the BW of the opamp is wide-enough, the signal will pass through to the output with some attenuation and get aliased by the clock circuit 134. The present example is shown where the gain of the programmable amplifier 100 is set to 18 decibels (dB), nevertheless, relatively similar performance values have been shown for other gain settings of the programmable amplifier 100.

Figure 5:
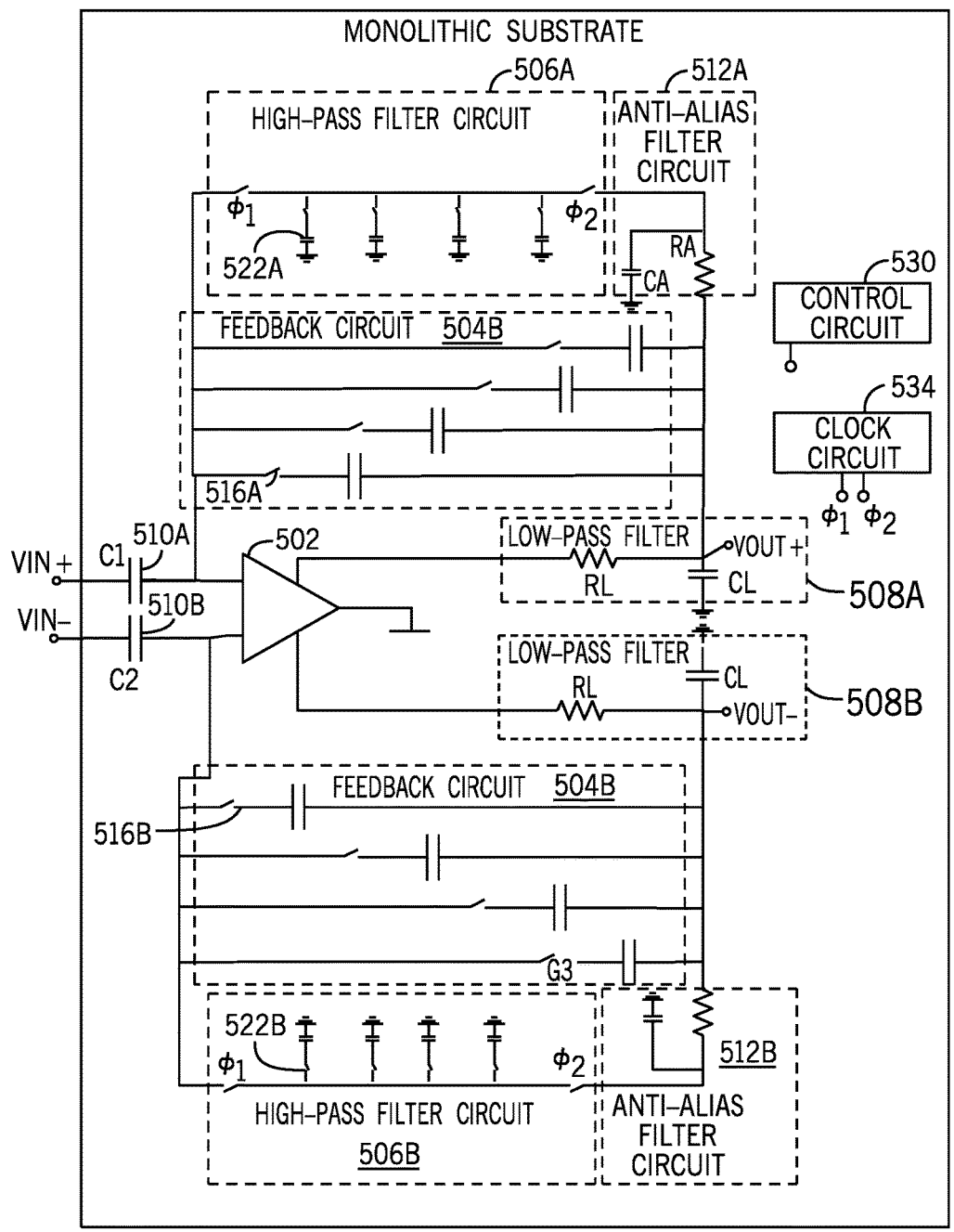
FIG. 5 illustrates another example programmable amplifier according to one embodiment of the present disclosure.

FIG. 5 illustrates another example programmable amplifier 500 according to one embodiment of the present disclosure. The programmable amplifier 500 of FIG. 5 has a control circuit 530 and a clock circuit 534 that are similar in design and construction to the control circuit 130 and clock circuit 134 of FIG. 1. The programmable amplifier 500 differs, however, in that it includes a differential amplifier 502 having first and second inputs for receiving a differential input signal and first and second outputs for outputting an amplified differential output signal. Additionally, the programmable amplifier 500 has a first feedback circuit 504a, a first high-pass filter circuit 506a, an first input capacitor 510a, a first low-pass filter 508a, and an first anti-alias filter 512a coupled between the first input and first output as shown, and a second feedback circuit 504b, a second high-pass filter circuit 506b, an second input capacitor 510b, a second low-pass filter 508b, and an second anti-alias filter 512b coupled between the second input and second output as shown.

In general, the programmable amplifier 100 of FIG. 1 may be referred to as a single-ended programmable amplifier configuration, while the programmable amplifier 500 of FIG. 5 may be referred to as a differential programmable amplifier configuration. Independent control of the gain and the high-pass cutoff frequency of the programmable amplifier 500 may be controlled in a similar manner as described above for the single-ended amplifier configuration of FIG. 1 except that the feedback switches 516a and 516b may be switched simultaneously for varying the gain through the programmable amplifier 500, while the switched capacitor switches 522a and 522b may be switched simultaneously for varying the high-pass cutoff frequency independently of the gain of the programmable amplifier 500.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A programmable amplifier comprising:
an amplifier having an amplifier input and an amplifier output;
an input capacitor coupled to the amplifier input and configured to receive a signal;
a feedback circuit comprising a plurality of feedback capacitors of differing capacitance values that are each selectively coupled between the amplifier output and the amplifier input by a corresponding plurality of first switches;
a high-pass filter circuit comprising a plurality of switched capacitors of differing capacitance values that are each selectively coupled between the amplifier output and a ground node by a corresponding plurality of second switches, the high-pass filter circuit including a clock circuit for alternatively coupling the switched capacitors between the amplifier output and the amplifier input,
wherein at least one of the plurality of first switches is configured to be switched on for activating at least one feedback capacitor to adjust a gain of the amplifier, and
wherein at least one of the plurality of second switches is configured to be switched on to adjust a high-pass cutoff frequency of the amplifier independently of how the gain is adjusted; and
a control circuit to control the plurality of first switches and the plurality of second switches for adjusting the gain and the high-pass cutoff frequency of the amplifier wherein the control circuit is further configured to control the plurality of first switches and the plurality of second switches to adjust the high-pass cutoff frequency independently of how the gain is adjusted wherein the amplifier, the plurality of feedback capacitors, the plurality of first switches, the plurality of switched capacitors, and the plurality of second switches are integrally formed on a monolithic substrate, and wherein the input capacitor is formed external to the monolithic substrate.

2. A programmable amplifier comprising:
an amplifier having an amplifier input and an amplifier output;
an input capacitor coupled to the amplifier input and configured to receive a signal;
a feedback circuit comprising a plurality of feedback capacitors of differing capacitance values that are each selectively coupled between the amplifier output and the amplifier input by a corresponding plurality of first switches; and
a high-pass filter circuit comprising a plurality of switched capacitors of differing capacitance values that are each selectively coupled between the amplifier output and a ground node by a corresponding plurality of second switches, the high-pass filter circuit including a clock circuit for alternatively coupling the switched capacitors between the amplifier output and the amplifier input,
wherein at least one of the plurality of first switches is configured to be switched on for activating at least one feedback capacitor to adjust a gain of the amplifier,
wherein at least one of the plurality of second switches is configured to be switched on to adjust a high-pass cutoff frequency of the amplifier independently of how the gain is adjusted; and
a control circuit to control the plurality of first switches and the plurality of second switches for adjusting the gain and the high-pass cutoff frequency of the amplifier wherein the amplifier, the plurality of feedback capacitors, the plurality of first switches, the plurality of switched capacitors, the plurality of second switches, the input capacitor, and the control circuit are integrally formed on a monolithic substrate.

3. The programmable amplifier of claim 1, further comprising a low-pass filter comprising a resistor-capacitor (RC) circuit having a low-pass filter resistor and a low-pass filter capacitor, the low-pass filter resistor coupled between the amplifier output and the plurality of feedback capacitors, and the low-pass filter capacitor coupled between the amplifier output and the ground node.

4. The programmable amplifier of claim 3, wherein the clock circuit generates a clock signal with a frequency that is at least twice the low-pass cutoff frequency.

5. The programmable amplifier of claim 1, further comprising an anti-alias filter comprising a resistor-capacitor (RC) circuit having an anti-alias filter resistor and an anti-alias filter capacitor, the anti-alias resistor coupled between the amplifier output and the plurality of switched capacitors, and the anti-alias filter capacitor coupled between the amplifier output and the ground node.

6. The programmable amplifier of claim 1, wherein the amplifier comprises at least one thick gate transistor.

7. The programmable amplifier of claim 1, wherein the amplifier comprises a differential amplifier having first and second inputs and first and second outputs, the programmable amplifier further comprising:
a first feedback circuit and a first frequency compensation circuit coupled to the first input and the first output; and
a second feedback circuit and a second frequency compensation circuit coupled to the second input and the second output.

8. The programmable amplifier of claim 1, configured as one of a plurality of programmable amplifiers on a monolithic substrate.

9. A method of forming a programmable amplifier comprising:
forming the programmable amplifier to receive a signal by an amplifier input and an amplifier output via an input capacitor;
forming the programmable amplifier to selectively couple at least one of a plurality of feedback capacitors of differing capacitance values between the amplifier output and the amplifier input to adjust a gain of the amplifier, the feedback capacitors comprising a feedback circuit; and
forming the programmable amplifier to selectively couple a plurality of switched capacitors of differing capacitance values between the amplifier output and a ground node to adjust a high-pass cutoff frequency of the amplifier, wherein the plurality of switched capacitors comprise a switched capacitor filter circuit that is switched at a first and second phase of a clock signal the programmable amplifier configured to selectively couple the plurality of switched capacitors alternately to the amplifier output and to the amplifier input.

10. The method of claim 9, further comprising controlling the coupling of the plurality of feedback capacitors and the plurality of switched capacitors using a control circuit.

11. The method of claim 10, further comprising controlling the coupling of the plurality of feedback capacitors and the plurality of switched capacitors using a control circuit to adjust the high-pass cutoff frequency independently of how the gain is adjusted.

12. The method of claim 10, further comprising integrally forming the amplifier, the plurality of feedback capacitors, the plurality of first switches, the plurality of switched capacitors, the plurality of second switches, the input capacitor, and the control circuit on a monolithic substrate.

13. The method of claim 10, further comprising integrally forming an amplifier comprising a differential amplifier having first and second inputs and first and second outputs on the monolithic substrate, the programmable amplifier further comprising:
a first feedback circuit and a first frequency compensation circuit coupled to the first input and the first output; and
a second feedback circuit and a second frequency compensation circuit coupled to the second input and the second output.

14. The method of claim 10, integrally forming a plurality of the programmable amplifiers on the monolithic substrate.

15. The method of claim 9, further comprising:
integrally forming the amplifier, the plurality of feedback capacitors, the plurality of first switches, the plurality of switched capacitors, the plurality of second switches, and the control circuit on a monolithic substrate; and
configuring the input capacitor external to the monolithic substrate.

16. The method of claim 9, further comprising filtering the signal using a low-pass filter comprising a resistor-capacitor (RC) circuit having a low-pass filter resistor and a low-pass filter capacitor, the low-pass resistor coupled between the amplifier output and the feedback capacitors, and the low-pass filter capacitor coupled between the amplifier output and the ground node.

17. The of claim 16, further comprising clocking the clock signal at a frequency that is at least twice the low-pass cutoff frequency.

18. The method of claim 9, further comprising filtering the signal using an anti-alias filter comprising a resistor-capacitor (RC) circuit having an anti-alias filter resistor and an anti-alias filter capacitor, the anti-alias resistor coupled between the amplifier output and the plurality of switched capacitors, and the anti-alias filter capacitor coupled between the amplifier output and the ground node.

19. The method of claim 9, wherein the amplifier comprises a differential amplifier having first and second inputs and first and second outputs, the programmable amplifier further comprising:
a first feedback circuit and a first frequency compensation circuit coupled to the first input and the first output; and
a second feedback circuit and a second frequency compensation circuit coupled to the second input and the second output.

20. The method of claim 9, configured as one of a plurality of programmable amplifiers on a monolithic substrate.

21. A programmable amplifier comprising:
an amplifier having an amplifier input and an amplifier output;
an input capacitor coupled to the amplifier input and configured to receive a signal;
a feedback circuit comprising a plurality of feedback capacitors of differing capacitance values that are each selectively coupled between the amplifier output and the amplifier input by a corresponding plurality of first switches; and
a high-pass filter circuit comprising a plurality of switched capacitors of differing capacitance values that are each selectively coupled between the amplifier output and a ground node by a corresponding plurality of second switches, the high-pass filter circuit including a clock circuit for alternatively coupling the switched capacitors between the amplifier output and the amplifier input;
a low-pass filter comprising a resistor-capacitor (RC) circuit having a low-pass filter resistor and a low-pass filter capacitor, the low-pass resistor coupled between the amplifier output and the plurality of feedback capacitors, and the low-pass filter capacitor coupled between the amplifier output and the ground node; and an anti-alias filter comprising a resistor-capacitor (RC) circuit having an anti-alias filter resistor and an anti-alias filter capacitor, the anti-alias resistor coupled between the amplifier output and the plurality of switched capacitors, and the anti-alias filter capacitor coupled between the amplifier output and the ground node, wherein at least one of the plurality of first switches is configured to be switched on for activating at least one feedback capacitor to adjust a gain of the amplifier, wherein at least one of the plurality of second switches is configured to be switched on to adjust a high-pass cutoff frequency of the amplifier independently of how the gain is adjusted, and wherein the amplifier, the plurality of feedback capacitors, the plurality of first switches, the plurality of switched capacitors, the plurality of second switches, the input capacitor, and the control circuit are integrally formed on a monolithic substrate.

* * * * *